(12) United States Patent
Lin et al.

(10) Patent No.: US 11,211,445 B2
(45) Date of Patent: Dec. 28, 2021

(54) FOLDABLE DISPLAY PANEL

(71) Applicant: AU Optronics Corporation, Hsin-Chu (TW)

(72) Inventors: Ming-Wei Lin, Hsin-Chu (TW); Pao-Yu Huang, Hsin-Chu (TW); Wen-Hui Lee, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 69 days.

(21) Appl. No.: 16/910,134

(22) Filed: Jun. 24, 2020

(65) Prior Publication Data

US 2021/0020727 A1 Jan. 21, 2021

Related U.S. Application Data

(60) Provisional application No. 62/874,677, filed on Jul. 16, 2019.

(30) Foreign Application Priority Data

Apr. 6, 2020 (TW) ................................ 109111507

(51) Int. Cl.
*H01L 27/32* (2006.01)
*H01L 51/00* (2006.01)
(Continued)

(52) U.S. Cl.
CPC .......... *H01L 27/3276* (2013.01); *H01L 24/32* (2013.01); *H01L 51/0097* (2013.01);
(Continued)

(58) Field of Classification Search
CPC ............. H01L 27/3276; H01L 27/3265; H01L 27/3248; H01L 24/32; H01L 51/0097;
(Continued)

(56) References Cited

U.S. PATENT DOCUMENTS 9,936,591 B2 * 4/2018 Kim ...................... H05K 1/113
10,034,367 B2 * 7/2018 Park ...................... H01L 25/167
(Continued)

FOREIGN PATENT DOCUMENTS

CN 203242247 U 10/2013
CN 107346082 A 11/2017
(Continued)

*Primary Examiner* — Ida M Soward
(74) *Attorney, Agent, or Firm* — McClure, Qualey & Rodack, LLP

(57) ABSTRACT

The foldable display panel includes a substrate and a pixel array. The substrate has a surface and display and periphery areas thereon. The periphery area is on at least one side of the display area, and has first and second bonding areas. The first and second bonding areas are at opposite first and second sides of the periphery area, respectively. The first and second bonding areas are spaced apart by a first distance along a first direction. The substrate has a foldable line passing through a center of the display area between the first and the second bonding areas. The first and second sides are on two sides of the foldable line. The pixel array is on the display area and overlaps the foldable line. The pixel array is between the first and second sides and includes sub pixel units arranged in an array.

10 Claims, 10 Drawing Sheets

(51) Int. Cl.
*H01L 51/50* (2006.01)
*H01L 51/52* (2006.01)
*H01L 23/00* (2006.01)

(52) U.S. Cl.
CPC ............... *G09G 2300/0443* (2013.01); *G09G 2300/0447* (2013.01); *H01L 27/3248* (2013.01); *H01L 27/3265* (2013.01); *H01L 51/5056* (2013.01); *H01L 51/5072* (2013.01); *H01L 51/5088* (2013.01); *H01L 51/5092* (2013.01); *H01L 51/5203* (2013.01); *H01L 2224/32227* (2013.01); *H01L 2251/556* (2013.01)

(58) Field of Classification Search
CPC ............. H01L 51/5203; H01L 51/5056; H01L 51/5072; H01L 51/5088; H01L 51/5092; H01L 2251/556; H01L 2300/5338; H01L 2300/0443; H01L 2251/0447
See application file for complete search history.

(56) References Cited

U.S. PATENT DOCUMENTS

| | | | | |
|---|---|---|---|---|
| 10,573,700 | B2* | 2/2020 | Tsuno | H01L 29/41 |
| 10,622,434 | B2* | 4/2020 | Choi | G09G 3/3258 |
| 10,901,464 | B2* | 1/2021 | Seo | G06F 1/1681 |
| 10,963,080 | B2* | 3/2021 | Lee | G06F 3/0414 |
| 2014/0218273 | A1* | 8/2014 | Tanikame | H01L 27/1255 345/77 |
| 2018/0210299 | A1* | 7/2018 | Mochizuki | H01L 27/124 |
| 2019/0162994 | A1* | 5/2019 | Fujikawa | G02F 1/1339 |

FOREIGN PATENT DOCUMENTS

| | | |
|---|---|---|
| CN | 107703663 A | 2/2018 |
| CN | 109244675 A | 1/2019 |
| CN | 209057356 U | 7/2019 |

* cited by examiner

FOLDABLE DISPLAY PANEL

CROSS-REFERENCE TO RELATED APPLICATION

This application claims priority to U.S. Provisional Application Ser. No. 62/874,677, filed Jul. 16, 2019, and Taiwan Application Serial Number 109111507, filed Apr. 6, 2020, which is herein incorporated by reference in its entirety.

BACKGROUND

Field of Invention

The present invention relates to a foldable display panel.

Description of Related Art

The development of displays has a tendency of large screens. However, a screen with a greater size makes it less convenient to be carried. The foldable display can do both. It can provide a large screen when it's in a full screen mode, and its size is reduced when it's folded to be easily carried by a user. A circuit, which is configured to drive a pixel array on a center to display image, is usually disposed on a periphery of a display panel. However, when the display panel is folded, the circuits on opposite sides may collide with each other and be damaged. Therefore, there is an urgent need for a method that can solve the aforementioned problem.

SUMMARY

The disclosure provides a foldable display panel having a first bonding area and a second bonding area spaced apart along a first direction by a first distance, and the substrate has a foldable line passing through a center of the display area. When the foldable display panel is folded along the foldable line, the first bonding area can be free from being in contact with the second bonding area.

The foldable display panel of the present disclosure includes a substrate and a pixel array. The substrate includes a surface and a display area and a periphery area on the surface. The periphery area is on at least one side of the display area. The periphery area has at least one first bonding area and at least one second bonding area. The first bonding area and the second bonding area are at opposite first and second sides of the periphery area, respectively. The first bonding area and the second bonding area are spaced apart along a first direction by a first distance. The substrate has a foldable line passing through a center of the display area. The foldable line is between the first bonding area and the second bonding area and is parallel to the first direction. The pixel array is on the display area and overlaps the foldable line. The first side and the second side are on two sides of the foldable line, respectively. The pixel array is between the first side and the second side. The pixel array includes a plurality of sub pixel units, and the sub pixel units are arranged in an array.

In one embodiment of the present disclosure, the foldable display panel further includes a plurality of first bonding pads, a plurality of first signal lines, a plurality of second bonding pads and a plurality of second signal lines. The first bonding pads are disposed on the first bonding area. The first signal lines are connected between the first bonding pads and a portion of the sub pixel units. The second bonding pads are disposed on the second bonding area. The second signal lines are connected between the second bonding pads and another portion of the sub pixel units.

In one embodiment of the present disclosure, the periphery area has opposite third and fourth sides, the third side and the fourth side are between the first side and the second side, a sum of a shortest distance between the first bonding area and the third side and a length of the first bonding area along the first direction is less than a shortest distance between the second bonding area and the third side.

In one embodiment of the present disclosure, the number of the first bonding area is multiple, the first bonding areas are arranged at a first interval along the first direction, a sum of the shortest distance between the first bonding area and the third side, the length of the first bonding area along the first direction and the first interval is greater than a sum of the shortest distance between the second bonding area and the third side and a length of the second bonding area along the first direction.

In one embodiment of the present disclosure, the number of the first bonding area is multiple, the first bonding areas are arranged at a first interval along the first direction, the number of the second bonding area is multiple, the second bonding areas are arranged at a second interval along the first direction, a sum of the shortest distance between the first bonding area and the third side, twice the length of the first bonding area along the first direction and the first interval is less than a sum of the shortest distance between the second bonding area and the third side, a length of the second bonding area along the first direction and the second interval.

In one embodiment of the present disclosure, a shortest distance between the second bonding area and the third side is greater than a length of the first bonding area along the first direction.

In one embodiment of the present disclosure, a shortest distance between the first bonding area and the fourth side is greater than a sum of a shortest distance between the second bonding area and the fourth side and a length of the second bonding area along the first direction.

In one embodiment of the present disclosure, the foldable display panel further includes at least one driving chip. The driving chip is disposed on the first bonding area and is electrically connected to the first bonding pads.

In one embodiment of the present disclosure, the foldable display panel further includes an anisotropic conductive adhesive. The anisotropic conductive adhesive is disposed on the first bonding area. The anisotropic conductive adhesive is between the driving chip and the first bonding pads.

In one embodiment of the present disclosure, the foldable display panel further includes a plurality of scan lines and a plurality of data lines. The scan lines are disposed on the display area. The data lines are disposed on the display area. Each of the sub pixel units is electrically connected to one of the scan lines and one of the data lines. Each of the sub pixel units has at least one thin film transistor and an organic light emitting diode. The organic light emitting diode is electrically connected to the thin film transistor.

Based on above, in the foldable display panel of the present disclosure, the foldable display panel includes at least one first bonding area and at least one second bonding area. The first bonding area and the second bonding area are at opposite first and second sides of the periphery area, respectively. The first bonding area and the second bonding area are spaced apart along a first direction by a first distance. The substrate has a foldable line passing through a center of the display area. The foldable line is between the first bonding area and the second bonding area and is parallel to the first direction. The first side and the second side area on two sides of the foldable line, respectively. Therefore, when the foldable display panel is folded along the foldable line such that the first side and the second side of the substrate overlap with each other, the first bonding area does not overlap the second bonding area. In other words, the first bonding area can be free from being in contact with the second bonding area. Therefore, the first bonding pads disposed on the first bonding area and the second bonding pads disposed on the second bonding area are free from colliding with each other and damaged. The first printed circuit board on the first bonding area and the second printed circuit board on the second bonding area are free from colliding with each other and damaged as well.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
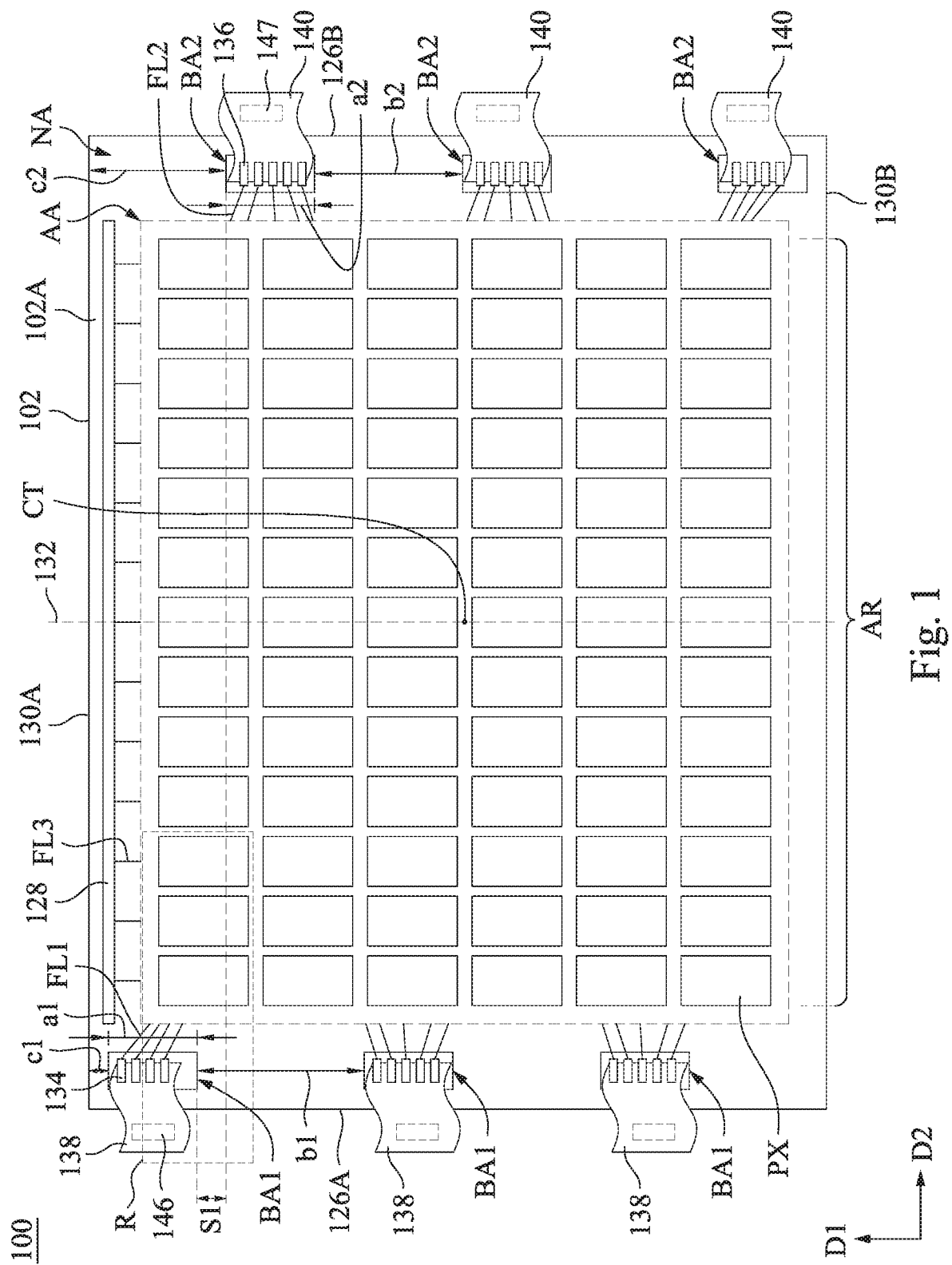
FIG. 1 is a top view of a foldable display panel in accordance with one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 is a top view of a foldable display panel 100 in accordance with one embodiment of the present disclosure. The foldable display panel 100 includes a substrate 102 and a pixel array AR. The substrate 102 has a surface 102A and a display area AA and a periphery area NA on the surface 102A. The pixel array AR is on the display area AA. The periphery area NA is on at least one side of the display area AA. For example, the periphery area NA may surround the display area AA. For convenience in describing, a first direction D1 and a second direction D2 are illustrated in FIG. 1. The first direction D1 and the second direction D2 are different. For example, the first direction D1 and the second direction D2 are a longitudinal direction and a horizontal direction in FIG. 1, respectively, and are in orthogonal relationship with each other.

Figure 2:
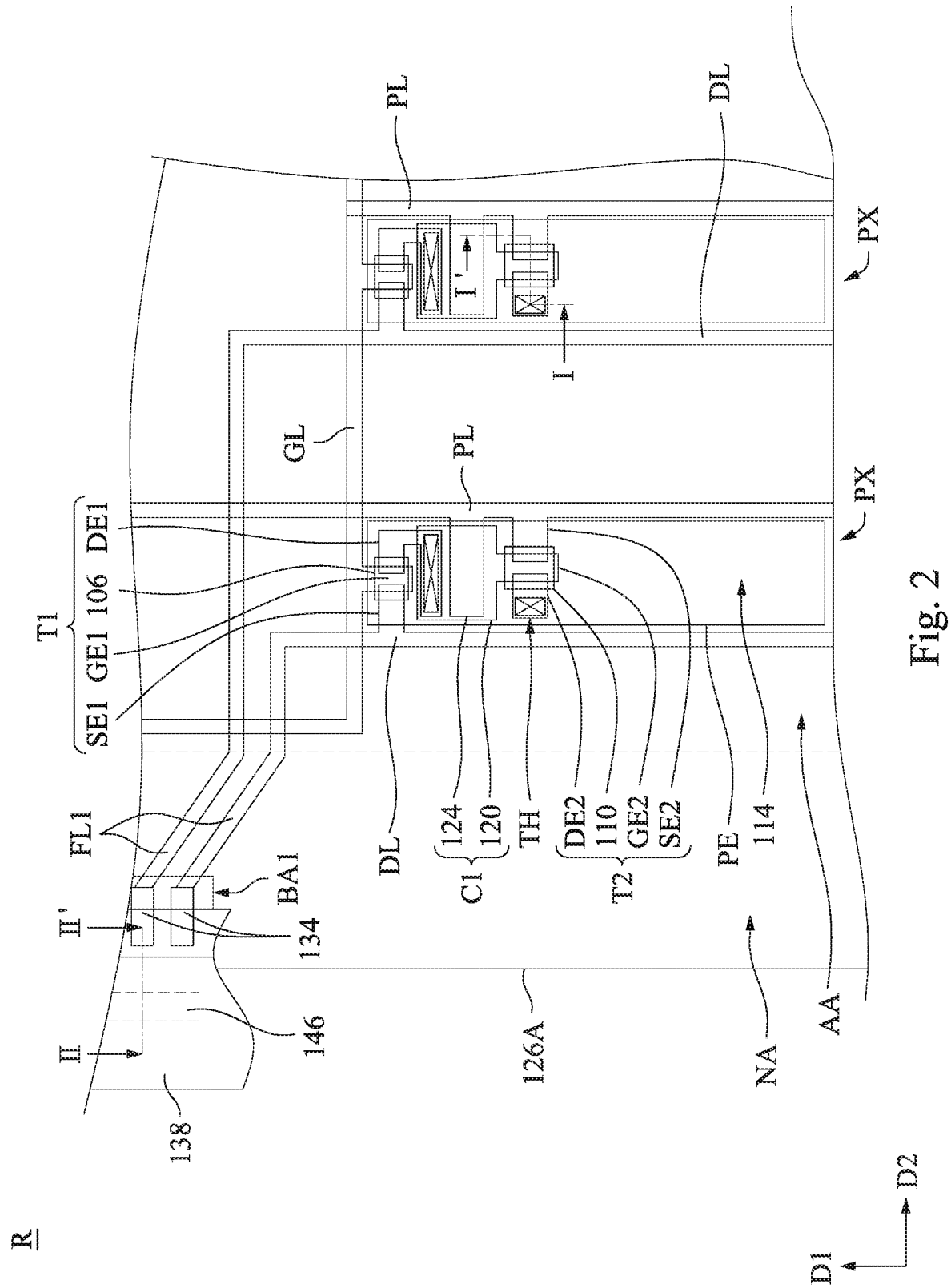
FIG. 2 is an enlarged view of a region R in FIG. 1.
Figure 3:
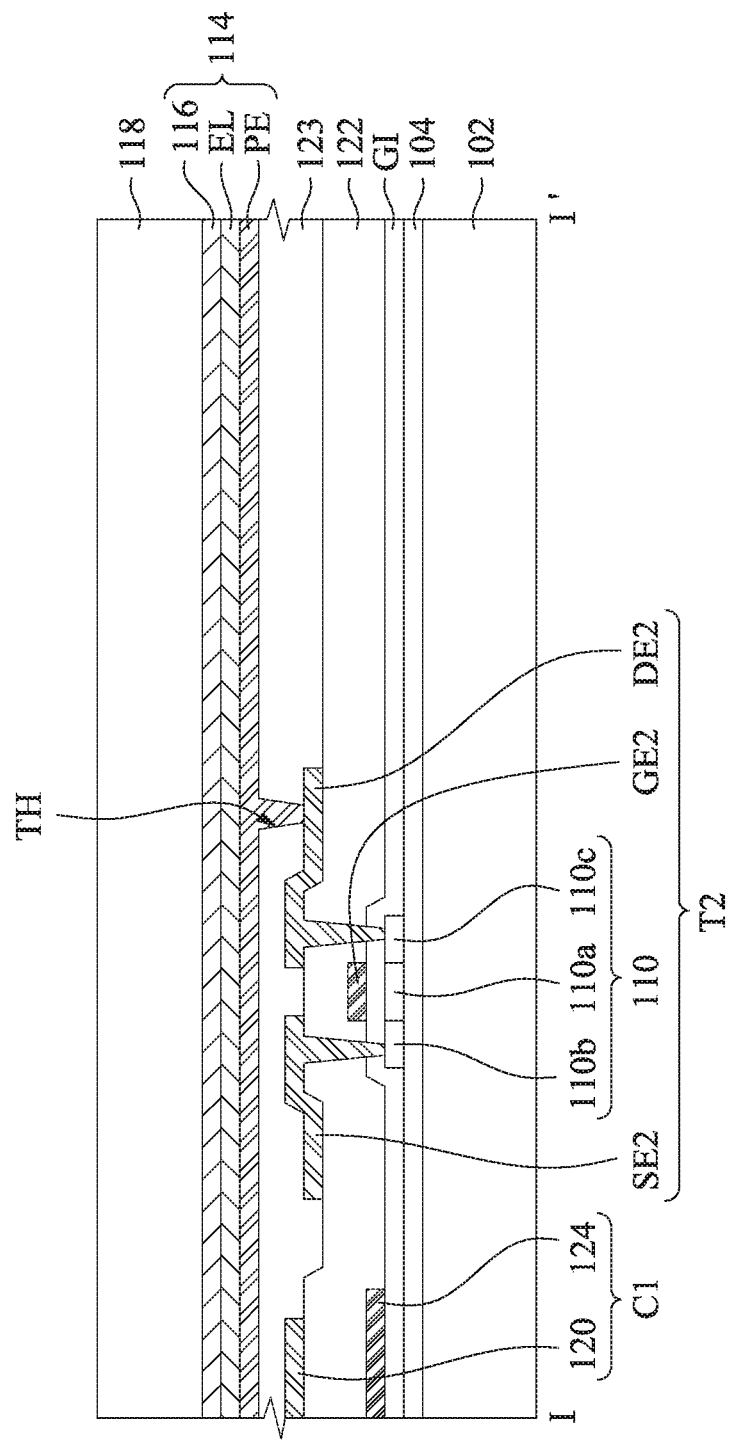
FIG. 3 is a cross-sectional view along line I-I' in FIG. 2.

The pixel array AR includes a plurality of sub pixel units PX. Each of the sub pixel units PX are arranged in an array. FIG. 2 is an enlarged view of a region R in FIG. 1. FIG. 3 is a cross-sectional view along line I-I' in FIG. 2. The foldable display panel 100 is not limited to the structure described below, and may be formed of an organic light emitting diode or a flexible liquid crystal display (LCD) having different structures. Reference is made to FIG. 2 and FIG. 3. The sub pixel unit PX includes a switch thin film transistor T1, a driving thin film transistor T2 and a capacitor C1. The foldable display panel 100 further includes a plurality of gate lines GL, a plurality of data lines DL and a plurality of common power lines PL. The data lines DL and the common power lines PL each intersect the gate lines GL. For example, the data lines DL and the common power lines PL are parallel to the first direction D1. The gate lines GL are parallel to the second direction D2. In the present embodiment, the sub pixel unit PX takes a structure of two-transistor one-capacitor (2T1C) for example. However, the present disclosure is not limited to. In the present embodiment, the foldable display panel 100 further includes a buffer layer 104 and a gate insulator layer GI (see FIG. 3). The buffer layer 104 is disposed between the substrate 102 and a switch semiconductor layer 106 (not shown in FIG. 3) and a driving semiconductor layer 110. The gate insulator layer GI is disposed on the switch semiconductor layer 106 (not shown in FIG. 3) and the driving semiconductor layer 110. A switch gate GE1 and a driving gate GE2 are disposed on the gate insulator layer GI. However, the present disclosure is not limited to. In other embodiment of the present embodiment, the buffer layer 104 may be omitted. A material of the gate insulator layer GI may include inorganic materials (e.g., silicon oxide, silicon nitride, silicon oxynitride, other suitable material, or a combination thereof).

The switch thin film transistor T1 includes the switch gate GE1, the switch semiconductor layer 106, a switch insulator layer 108, a switch source SE1 and a switch drain DE1. The driving thin film transistor T2 includes the driving gate GE2, the driving semiconductor layer 110, a driving insulator layer 112, a driving source SE2 and a driving drain DE2. The switch semiconductor layer 106 and the driving semiconductor layer 110 may be formed of polycrystalline silicon or an oxide semiconductor. In the present embodiment, materials of the switch semiconductor layer 106 and the driving semiconductor layer 110 may include polycrystalline silicon. That is, the switch thin film transistor T1 and the driving thin film transistor T2 may be low temperature poly silicon thin film transistor (LTPS TFT). However, the present disclosure is not limited to the types of the switch thin film transistor T1 and the driving thin film transistor T2. In other embodiments, the materials of the switch semiconductor layer 106 and the driving semiconductor layer 110 may include amorphous silicon, microcrystalline silicon, nanocrystalline silicon, single crystalline silicon, organic semiconductor material, metal oxide semiconductor material, carbon nanotube, perovskite or other suitable materials.

The switch semiconductor layer 106 includes a channel region (not shown, not doped with dopants), a source region (not shown) and a drain region (not shown). The driving semiconductor layer 110 includes a channel region 110a (not doped with dopants), a source region 110b and a drain region 110c. The source region 110b and the drain region 110c are formed on two sides of the channel region 110a, respectively, and are doped with dopants. Here the dopants used depend on the type of the thin film transistor and may include N-type dopants or P-type dopants.

In the present embodiment, the foldable display panel 100 further includes a protective layer 123. The protective layer 123 is on the switch thin film transistor T1 (not shown in FIG. 3), the driving thin film transistor T2 and the capacitor C1. The protective layer 123 may include inorganic materials, organic materials or a combination thereof. The inorganic materials, for example, may be silicon oxide, silicon nitride, silicon oxynitride or a stacked layer of at least two of the above-mentioned materials. The organic materials may be, for example, a polymer material such as polyimide-based resin, epoxy-based resin or acrylic-based resin.

The sub pixel unit PX further includes an organic light emitting diode 114. The organic light emitting diode 114 includes a pixel electrode PE, an organic light emitting layer EL, a common electrode 116 and a packaging layer 118. One of the pixel electrode PE and the common electrode 116 is a hole injection electrode, and another one thereof is an electron injection electrode. Electrons and holes are injected into the organic light emitting layer EL from the pixel electrode PE and the common electrode 116 such that the holes and the electrons recombine resulting in emission of light. The pixel electrode PE is formed of high reflectivity metal. The common electrode 116 is formed of a transparent conductive material. The light emitted by the organic light emitting layer EL is reflected by the pixel electrode PE and is emitted to outside through the common electrode 116 and the packaging layer 118. In the present embodiment, the packaging layer 118 covers the organic light emitting diode 114 to isolate the organic light emitting diode 114 from moisture. The material of the packaging layer 118 may include, but is not limited to, silicon nitride, aluminum oxide or silicon oxynitride.

The capacitor C1 may include a top electrode 120, an interlayer insulation layer 122 and a bottom electrode 124. The interlayer insulation layer 122 is between the top electrode 120 and the bottom electrode 124 and includes a dielectric material. The switch thin film transistor T1 is used for a switch to select a sub pixel unit PX for emitting light. The switch gate GE1 is connected to the gate line GL. The switch source SE1 is connected to the data line DL. The switch drain DE1 is connected to the top electrode 120 of the capacitor C1. The driving thin film transistor T2 applies a driving power to the pixel electrode PE of the selected sub pixel unit PX, so that the organic light emitting layer EL emits light. The driving gate GE2 is connected to the top electrode 120. The top electrode 120 is connected to the switch drain DE1. The driving source SE2 and the bottom electrode 124 are connected to the common power line PL1. The driving drain DE2 is connected to the pixel electrode PE of the organic light emitting diode 114 through the through hole TH.

The switch thin film transistor T1 is driven by the gate voltage applied to the gate line GL to transmit the data voltage applied on the data line DL to the driving thin film transistor T2. A voltage corresponding to a voltage difference between the common voltage applied to the driving thin film transistor T2 from the common power line PL and the data voltage transmitted from the switch thin film transistor T1 is stored in the capacitor C1. A current corresponding to the voltage stored in the capacitor C1 is flowed to the organic light emitting diode 114 through the driving thin film transistor T2, so that the organic light emitting layer EL emits light.

The organic light emitting layer EL is formed of polymer organic materials. The organic light emitting layer EL may be a multi-layer and includes at least one of a light emitting layer, a hole injection layer (HIL), a hole transporting layer (HTL), an electron transporting layer (ETL) and an electron injection layer (EIL). In an example where the organic light emitting layer EL includes the light emitting layer, the hole injection layer, the hole transporting layer, the electron transporting layer and the electron injection layer, the hole injection layer, the hole transporting layer, the light emitting layer, the electron transporting layer and the electron injection layer are stacked over the pixel electrode PE from bottom to top.

In the present embodiment, the organic light emitting layer EL may be a light emitting layer known in the art that is generally used in display panels. The organic light emitting layer EL may be a red organic light emitting layer, a green organic light emitting layer, a blue organic light emitting layer, an organic light emitting layer of other colors or a combination thereof.

The periphery area NA has a first side 126A and a second side 126B opposite the first side 126A. The pixel array AR is between the first side 126A and the second side 126B. In the present embodiment, the periphery area NA has at least one first bonding area BA1 and at least one second bonding area BA2. For example, the first bonding area BA1 and the second bonding area BA2 are on opposite first side 126A and second side 126B of the periphery area NA, respectively.

The substrate 102 has a foldable line 132 passing through a center of the display area AA. The first side 126A and the second side 126B are on two sides of the foldable line 132, respectively. The foldable line 132 is between the first bonding area BA1 and the second bonding area BA2 and is parallel to the first direction D1. The pixel array AR overlaps the foldable line 132. The foldable display panel 100 further includes a plurality of first signal lines FL1 and a plurality of first bonding pads 134. The first bonding pads 134 are disposed on the first bonding area BA1. Each of the first bonding pads 134 are on one end of each of the first signal lines FL1. Another end of the first signal line FL1 is connected to the data line DL such that the first signal lines FL1 are electrically connected to the first bonding pads 134 and can be electrically connected to a portion of the sub pixel units PX through the data lines DL. The foldable display panel 100 further includes a plurality of second signal lines FL2 and a plurality of second bonding pads 136. The second bonding pads 136 are disposed on the second bonding area BA2. Each of the second bonding pads 136 are on one end of each of the second signal lines F12. Another end of the second signal line FL2 is connected to the data line DL (not shown) such that the second signal lines FL2 are electrically connected to the second bonding pads 136 and can be electrically connected to another portion of the sub pixel units PX through the data lines DL.

The foldable display panel 100 further includes a driving circuit 128 and a plurality of third signal lines FL3. The driving circuit 128 is on one side of the periphery area NA. For example, the periphery area NA further includes a third side 130A and a fourth side 130B opposite the third side 130A. The third side 130A, the fourth side 130B, the first side 126A and the second side 126B together form an outer edge of the periphery area NA. The foldable line 132 passes through the third side 130A and the fourth side 130B. The driving circuit 128 is between the third side 130A of the periphery area NA and the pixel array AR. The driving circuit 128 is between the first bonding area BA1 and the second bonding area BA2. The third signal lines FL3 is between the driving circuit 128 and the pixel array AR. The driving circuit 128 is, for example, gate driver on array (GOA). That is, active devices (not shown) of the driving circuit 128 are made together with the switch thin film transistor T1 and the driving thin film transistor T2. But the present disclosure is not limited thereto. The pixel array AR is electrically connected to the driving circuit 128 through the third signal lines FL3. In the present embodiment, the first side 126A and the second side 126B are parallel to the first side D1. The third side 130A and the fourth side 130B are parallel to the second direction D2.

In the present embodiment, the foldable display panel 100 further includes a first printed circuit board 138 and a second printed circuit board 140. The first printed circuit board 138 is disposed on the first bonding area BA1. The first bonding pads 134 are electrically connected to the first printed circuit board 138. The second printed circuit board 140 is disposed on the second bonding area BA2. The second bonding pads 136 are electrically connected to the second printed circuit board 140.

Figure 4:
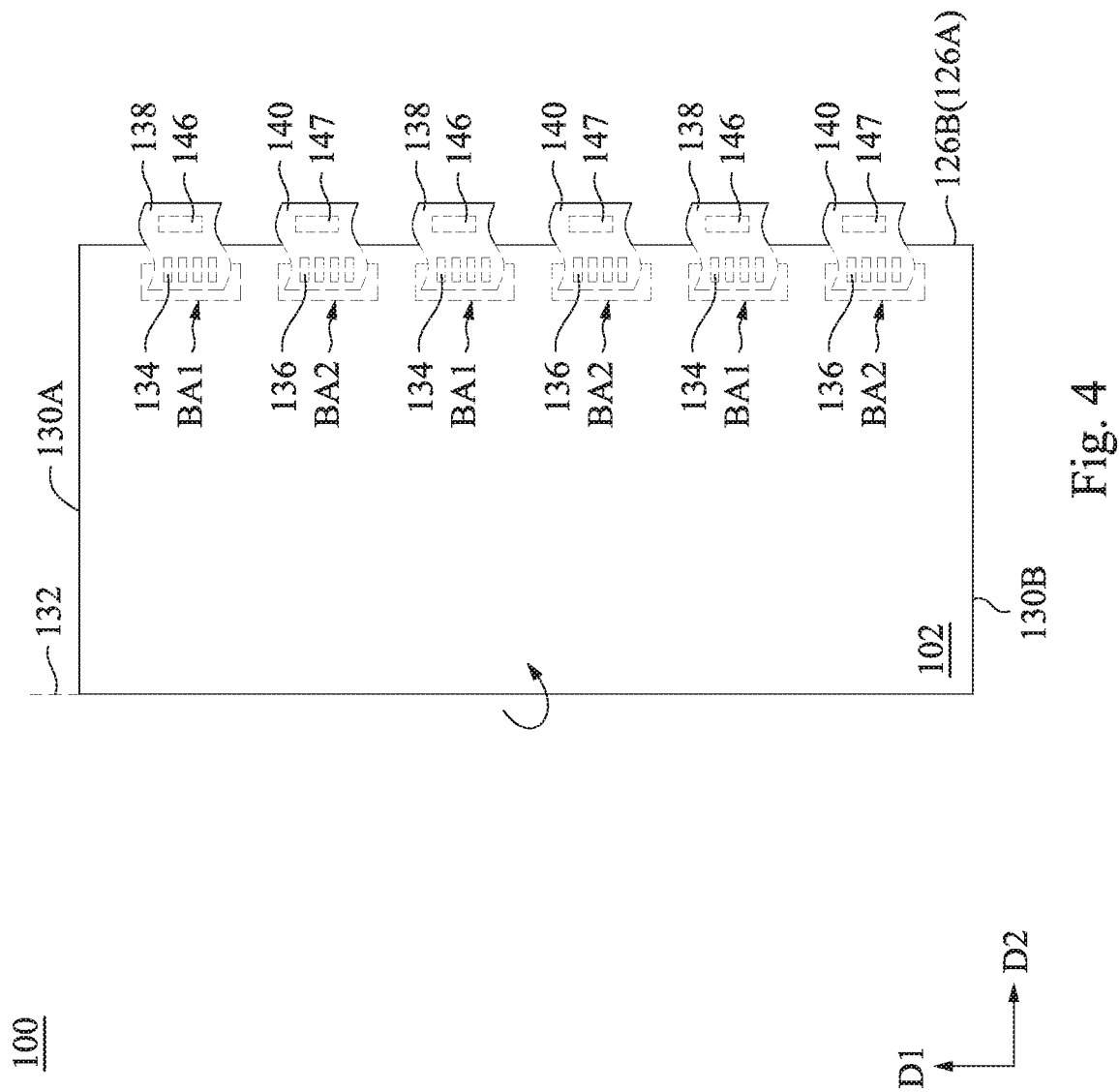
FIG. 4 is a top view of FIG. 1 after being folded along a foldable line.

FIG. 4 is a top view of FIG. 1 after being folded along a foldable line 132. Reference is made to FIG. 1 and FIG. 4. In the present embodiment, the first bonding area BA1 and the second bonding area BA2 are spaced apart along a first direction D1 by a first distance S1. Therefore, after the foldable display panel 100 is folded along the foldable line 132 such that the first side 126A and the second side 126B of the substrate 102 overlap with each other, the first bonding area BA1 do not overlap the second bonding area BA2. In other words, the first bonding area BA1 may be free from in contact with the second bonding area BA2. Therefore, the first bonding pads 134 on the first bonding area BA1 and the second bonding pads 136 on the second bonding area BA2 are free from colliding with each other and damaged. The first printed circuit board 138 on the first bonding area BA1 and the second printed circuit board 140 on the second bonding area BA2 are free from colliding with each other and damaged as well.

A sum of a shortest distance c1 between the first bonding area BA1 and the third side 130A and the a length a1 of the first bonding area BA1 along the first direction D1 is less than a shortest distance c2 between the second bonding area BA2 and the third side 130A. For example, the shortest distance c1 between the first bonding area BA1 and the third side 130A is in a range from 3 mm to 7 mm. The length a1 of the first bonding area BA1 along the first direction D1 is 26 mm to 31 mm. The shortest distance c2 between the second bonding area BA2 and the third side 130A is 39 mm to 43 mm. In this way, after the foldable display panel 100 is folded along the foldable line 132 such that the first side 126A and the second side 126B of the substrate 102 overlap with each other, the first bonding area BA1 do not overlap the second bonding area BA2. In other words, the first bonding area BA1 may be free from in contact with the second bonding area BA2. Therefore, the first bonding pads 134 on the first bonding area BA1 and the second bonding pads 136 on the second bonding area BA2 are free from colliding with each other and damaged. The first printed circuit board 138 on the first bonding area BA1 and the second printed circuit board 140 on the second bonding area BA2 are free from colliding with each other and damaged as well.

In the present embodiment, the number of the first bonding area BA1 is multiple. The first bonding areas BA1 are arranged at an interval b1 along the first direction D1. A sum of the shortest distance c1 between the first bonding area BA1 and the third side 130A, the length a1 of the first bonding area BA1 along the first direction D1 and the interval b1 between the first bonding areas BA1 is greater than a sum of the shortest distance c2 between the second bonding area BA2 and the third side 130A and a length a2 of the second bonding area BA2 along the first direction D1. For example, the shortest distance c1 between the first bonding area BA1 and the third side 130A is from 3 mm to 7 mm. The length a1 of each of the first bonding areas BA1 along the first direction D1 is from 26 mm to 31 mm. The interval b1 between each of the first bonding areas BA1 is from 40 mm to 45 mm. The shortest distance c2 between the second bonding area BA2 and the third side 130A is from 39 mm to 43 mm. The length a2 of the second bonding area BA2 along the first direction D1 is from 26 mm to 31 mm. Therefore, after the foldable display panel 100 is folded along the foldable line 132 such that the first side 126A and the second side 126B of the substrate 102 overlap with each other, the first bonding area BA1 do not overlap the second bonding area BA2. In other words, the first bonding area BA1 may be free from in contact with the second bonding area BA2. Therefore, the first bonding pads 134 on the first bonding area BA1 and the second bonding pads 136 on the second bonding area BA2 are free from colliding with each other and damaged. The first printed circuit board 138 on the first bonding area BA1 and the second printed circuit board 140 on the second bonding area BA2 are free from colliding with each other and damaged as well.

In the present embodiment, the number of the second bonding area BA2 is multiple. The second bonding areas BA2 are spaced apart along a first direction D1 by an interval b2. A sum of the shortest distance c1 between the first bonding area BA1 and the third side 130A, twice the length a1 of the first bonding area BA1 along the first direction D1 and the interval b1 between the first bonding areas BA1 is less than a sum of the shortest distance c2 between the second bonding area BA2 and the third side 130A, the length a2 of the second bonding area BA2 along the first direction D1 and the interval b2 between the second bonding areas BA2. For example, the shortest distance c1 between the first bonding area BA1 and the third side 130A is from 3 mm to 7 mm. The length a1 of each of the first bonding areas BA1 along the first direction D1 is from 26 mm to 31 mm. The interval b1 between each of the first bonding areas BA1 is from 40 mm to 45 mm. The shortest distance c2 between the second bonding area BA2 and the third side 130A is from 39 mm to 43 mm. The length a2 of the second bonding area BA2 along the first direction D1 is from 26 mm to 31 mm. The interval b2 between each of the second bonding areas BA2 is 40 mm to 45 mm. In this way, after the foldable display panel 100 is folded along the foldable line 132 such that the first side 126A and the second side 126B of the substrate 102 overlap with each other, the first bonding area BA1 do not overlap the second bonding area BA2. In other words, the first bonding area BA1 may be free from in contact with the second bonding area BA2. Therefore, the first bonding pads 134 on the first bonding area BA1 and the second bonding pads 136 on the second bonding area BA2 are free from colliding with each other and damaged. The first printed circuit board 138 on the first bonding area BA1 and the second printed circuit board 140 on the second bonding area BA2 are free from colliding with each other and damaged as well.

Figure 5:
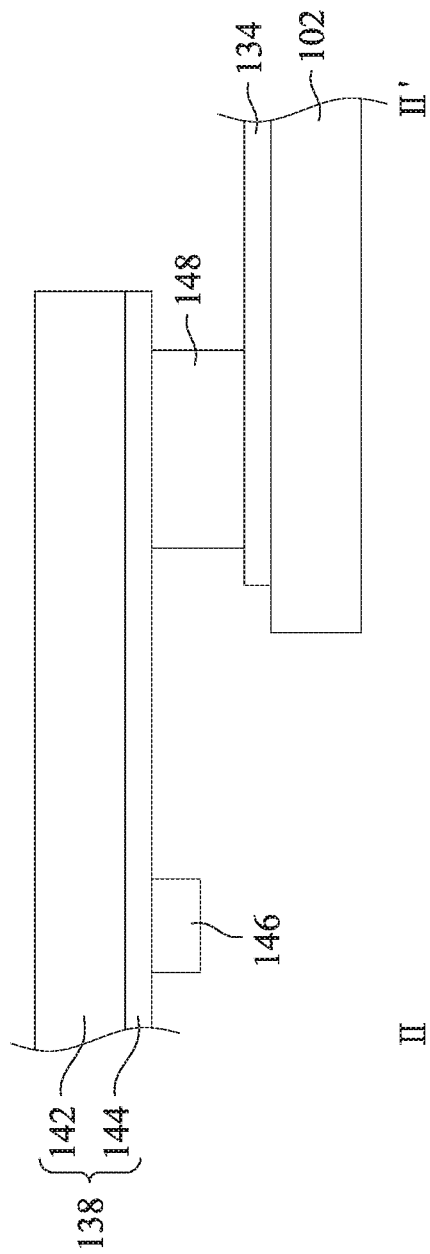
FIG. 5 is a cross-sectional view along line II-II' in FIG. 2.

FIG. 5 is a cross-sectional view along line II-II' in FIG. 2. Reference is made to FIG. 1, FIG. 2 and FIG. 5. The first printed circuit board 138 includes a flexible substrate 142 and a circuit layer 144 disposed on the flexible substrate 142. That is, the first printed circuit board 138 is a flexible printed circuit board (FPC). In the present embodiment, the foldable display panel 100 further includes a driving chip 146 on the circuit layer 144. The driving chip 146 is a chip on film (COF) structure. For example, the driving chip 146 can be electrically connected to the circuit layer 144 by a flip chip bonding technique. In other embodiments, the driving chip 146 may be electrically connected to the circuit layer 144 using other techniques. For example, the driving chip 146 is electrically connected to the circuit layer 144 using tape automated bonding (TAB) technique.

The foldable display panel 100 further includes an anisotropic conductive adhesive 148. The circuit layer 144 of the first printed circuit board 138 is electrically connected to the first bonding pads through the anisotropic conductive adhesive 148. The anisotropic conductive adhesive 148 is disposed between the first bonding pads 134 and the circuit layer 144 of the first printed circuit board 138. In the present embodiment, the foldable display panel 100 further includes a driving chip 147. The driving chip 147 is on the second printed circuit board 140. The structure of the second printed circuit board 140 and its configuration relationship with the second bonding pads 136 is similar to the structure of the first printed circuit board 138 and its configuration relationship with the first bonding pads 134. The configuration relationship between the driving chip 147 and the second printed circuit board 140 is similar to the configuration relationship between the driving chip 146 and the first printed circuit board 138, and thus will not be described in detail here.

Figure 6:
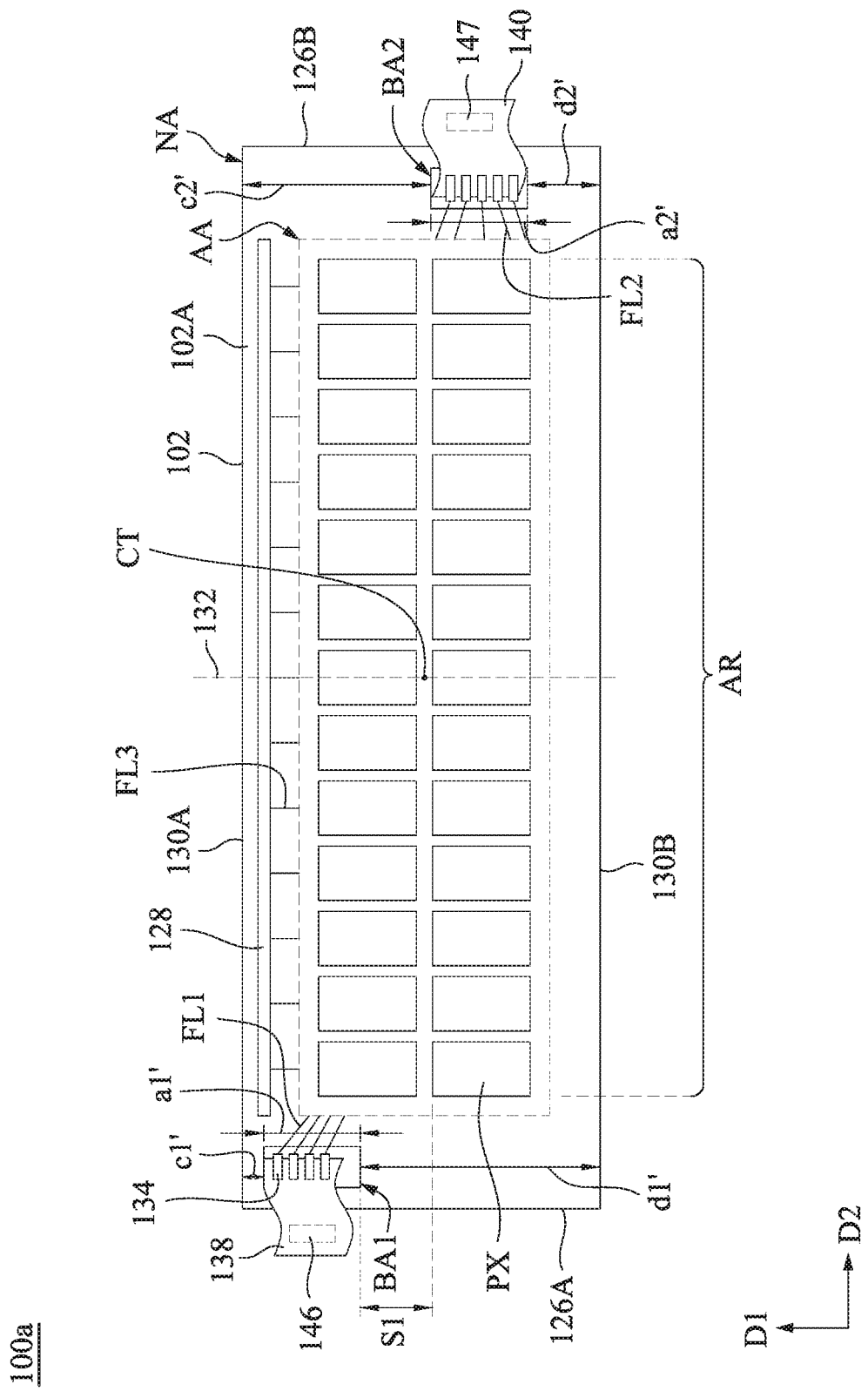
FIG. 6 is a top view of a foldable display panel in accordance with another embodiment of the present disclosure.

FIG. 6 is a top view of a foldable display panel 100a in accordance with another embodiment of the present disclosure. Reference is made to FIG. 6. The foldable display panel 100a in FIG. 6 is similar to the foldable display panel 100 in FIG. 1. Only the differences therebetween are discussed below, and the same parts or similarities therebetween will not be described in detail. A sum of the shortest distance c1 between the first bonding area BA1 and the third side 130A and the length a1' of the first bonding area BA1 along the first direction D1 is less than the shortest distance c2' between the second bonding area BA2 and the third side 130A. For example, the shortest distance c1 between the first bonding area BA1 and the third side 130A is from 1 mm to 5 mm. The length a1' of the first bonding area BA1 along the first direction D1 is from 50 mm to 55 mm. The shortest distance c2' between the second bonding area BA2 and the third side 130A is from 68 mm to 72 mm. Therefore, after the foldable display panel 100 is folded along the foldable line 132 such that the first side 126A and the second side 126B of the substrate 102 overlap with each other, the first bonding area BA1 do not overlap the second bonding area BA2. In other words, the first bonding area BA1 may be free from in contact with the second bonding area BA2. Therefore, the first bonding pads 134 on the first bonding area BA1 and the second bonding pads 136 on the second bonding area BA2 are free from colliding with each other and damaged. The first printed circuit board 138 on the first bonding area BA1 and the second printed circuit board 140 on the second bonding area BA2 are free from colliding with each other and damaged as well.

In the present embodiment, a shortest distance d1' between the first bonding area BA1 and the fourth side 130B is greater than a sum of a shortest distance d2' between the second bonding area BA2 and the fourth side 130B and the length a2' of the second bonding area BA2 along the first direction D1. For example, the shortest distance d1' between the first bonding area BA1 and the fourth side 130B is from 68 mm to 72 mm. The shortest distance d2' between the second bonding area BA2 and the fourth side 130B is from 1 mm to 5 mm. The length a2' of the second bonding area BA2 along the first direction D1 is from 50 mm to 55 mm. Therefore, after the foldable display panel 100 is folded along the foldable line 132 such that the first side 126A and the second side 126B of the substrate 102 overlap with each other, the first bonding area BA1 do not overlap the second bonding area BA2. In other words, the first bonding area BA1 may be free from in contact with the second bonding area BA2. Therefore, the first bonding pads 134 on the first bonding area BA1 and the second bonding pads 136 on the second bonding area BA2 are free from colliding with each other and damaged. The first printed circuit board 138 on the first bonding area BA1 and the second printed circuit board 140 on the second bonding area BA2 are free from colliding with each other and damaged as well.

Figure 7:
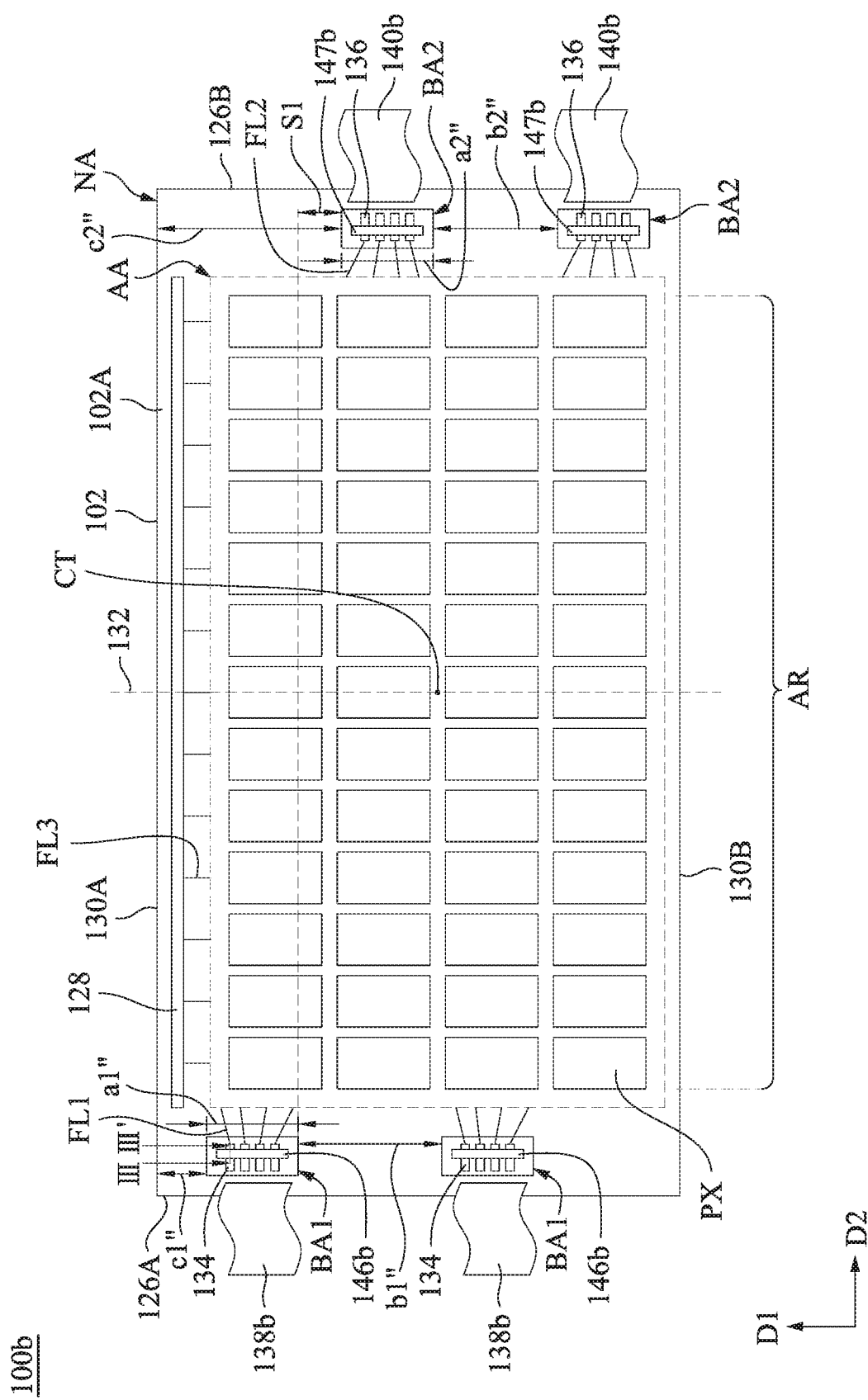
FIG. 7 is a top view of a foldable display panel in accordance with another embodiment of the present disclosure.
Figure 8:
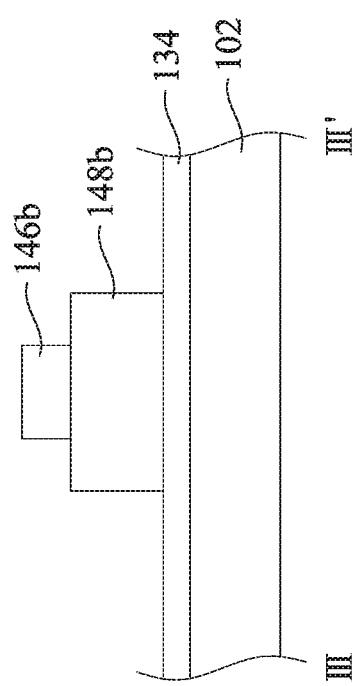
FIG. 8 is a cross-sectional view along line III-III' in FIG. 7.

FIG. 7 is a top view of a foldable display panel 100b in accordance with another embodiment of the present disclosure. FIG. 8 is a cross-sectional view along line III-III' in FIG. 7. The foldable display panel 100b in FIG. 7 is similar to the foldable display panel 100 in FIG. 1. Only the differences therebetween are discussed below, and the same parts or similarities therebetween will not be described in detail. Reference is made to FIG. 7 and FIG. 8. The driving chip 146b is disposed on the substrate 102 by a chip on glass (COG) technique. The foldable display panel 100b further includes an anisotropic conductive adhesive 148b between the driving chip 146b and the first bonding pads 134. The driving chip 146b is fixed to the first bonding pads 134 by the anisotropic conductive adhesive 148b. The first printed circuit board 138b is between the first bonding area BA1 and the first side 126A. The foldable display panel 100b can be bonded to the first printed circuit board 138b by pins (not shown) disposed on the periphery area NA of the substrate 102. The second printed circuit board 140b is between the second bonding area BA2 and the second side 126B. The foldable display panel 100b can be bonded to the second printed circuit board 140b by pins (not shown) disposed on the periphery area NA of the substrate 102.

The structure of the second printed circuit board 140b and its configuration relationship with the second bonding pads 136b is similar to the structure of the first printed circuit board 138b and its configuration relationship with the first bonding pads 134b. The configuration relationship between the driving chip 147b and the second printed circuit board 140b is similar to the configuration relationship between the driving chip 146b and the first printed circuit board 138b, and thus will not be described in detail here.

A sum of the shortest distance c1" between the first bonding area BA1 and the third side 130A and the length a1" of the first bonding area BA1 along the first direction D1 is less than the shortest distance c2" between the second bonding area BA2 and the third side 130A. For example, the shortest distance c1" between the first bonding area BA1 and the third side 130A is from 7 mm to 10 mm. The length a1" of the first bonding area BA1 along the first direction D1 is from 18 mm to 22 mm. The shortest distance c2" between the second bonding area BA2 and the third side 130A is from 34 mm to 38 mm. Therefore, after the foldable display panel 100 is folded along the foldable line 132 such that the first side 126A and the second side 126B of the substrate 102 overlap with each other, the first bonding area BA1 do not overlap the second bonding area BA2. In other words, the first bonding area BA1 may be free from in contact with the second bonding area BA2. Therefore, the first bonding pads 134 on the first bonding area BA1 and the second bonding pads 136 on the second bonding area BA2 are free from colliding with each other and damaged. The first printed circuit board 138 on the first bonding area BA1 and the second printed circuit board 140 on the second bonding area BA2 are free from colliding with each other and damaged as well.

In the present embodiment, the number of the first bonding area BA1 is multiple. The first bonding areas BA1 are arranged at an interval b1" along the first direction D1. A sum of the shortest distance c1" between the first bonding area BA1 and the third side 130A, the length a1" of the first bonding area BA1 along the first direction D1 and the interval b1" between the first bonding areas BA1 is greater than a sum of the shortest distance c2" between the second bonding area BA2 and the third side 130A and the length a2" of the second bonding area BA2 along the first direction D1. For example, the shortest distance c1" between the first bonding area BA1 and the third side 130A is from 7 mm to 10 mm. The length a1" of each of the first bonding areas BA1 along the first direction D1 is from 18 mm to 22 mm. The interval b1" between each of the first bonding areas BA1 is from 32 mm to 36 mm. The shortest distance c2" between the second bonding area BA2 and the third side 130A is from 34 mm to 38 mm. The length a2" of the second bonding area BA2 along the first direction D1 is from 18 mm to 22 mm. Therefore, after the foldable display panel 100 is folded along the foldable line 132 such that the first side 126A and the second side 126B of the substrate 102 overlap with each other, the first bonding area BA1 do not overlap the second bonding area BA2. In other words, the first bonding area BA1 may be free from in contact with the second bonding area BA2. Therefore, the first bonding pads 134 on the first bonding area BA1 and the second bonding pads 136 on the second bonding area BA2 are free from colliding with each other and damaged. The first printed circuit board 138 on the first bonding area BA1 and the second printed circuit board 140 on the second bonding area BA2 are free from colliding with each other and damaged as well.

In the present embodiment, the number of the second bonding area BA2 is multiple. The second bonding areas BA2 are arranged at an interval b2" along the first direction D1. A sum of the shortest distance c1" between the first bonding area BA1 and the third side 130A, twice the length a1" of the first bonding area BA1 along the first direction D1 and the interval b1" between the first bonding areas BA1 is less than the shortest distance c2" between the second bonding area BA2 and the third side 130A, the length a2" of the second bonding area BA2 along the first direction D1 and the interval b2" between the second bonding areas BA2. For example, the shortest distance c1" between the first bonding area BA1 and the third side 130A is from 7 mm to 10 mm. The length a1" of each of the first bonding areas BA1 along the first direction D1 is from 18 mm to 22 mm. The interval b1" between each of the first bonding areas BA1 is from 32 mm to 36 mm. The shortest distance c2" between the second bonding area BA2 and the third side 130A is from 34 mm to 38 mm. The length a2" of the second bonding area BA2 along the first direction D1 is from 18 mm to 22 mm. The interval b2" between each of the second bonding areas BA2 is from 32 mm to 36 mm. Therefore, after the foldable display panel 100 is folded along the foldable line 132 such that the first side 126A and the second side 126B of the substrate 102 overlap with each other, the first bonding area BA1 do not overlap the second bonding area BA2. In other words, the first bonding area BA1 may be free from in contact with the second bonding area BA2. Therefore, the first bonding pads 134 on the first bonding area BA1 and the second bonding pads 136 on the second bonding area BA2 are free from colliding with each other and damaged. The first printed circuit board 138 on the first bonding area BA1 and the second printed circuit board 140 on the second bonding area BA2 are free from colliding with each other and damaged as well.

In FIG. 1, FIG. 6 and FIG. 7, the number of the first bonding areas BA1 are the same as the number of the second bonding areas BA2. However, the present disclosure is not limited thereto. In other embodiment, the number of the first bonding areas BA1 may be different from the number of the second bonding areas BA2.

Figure 9:
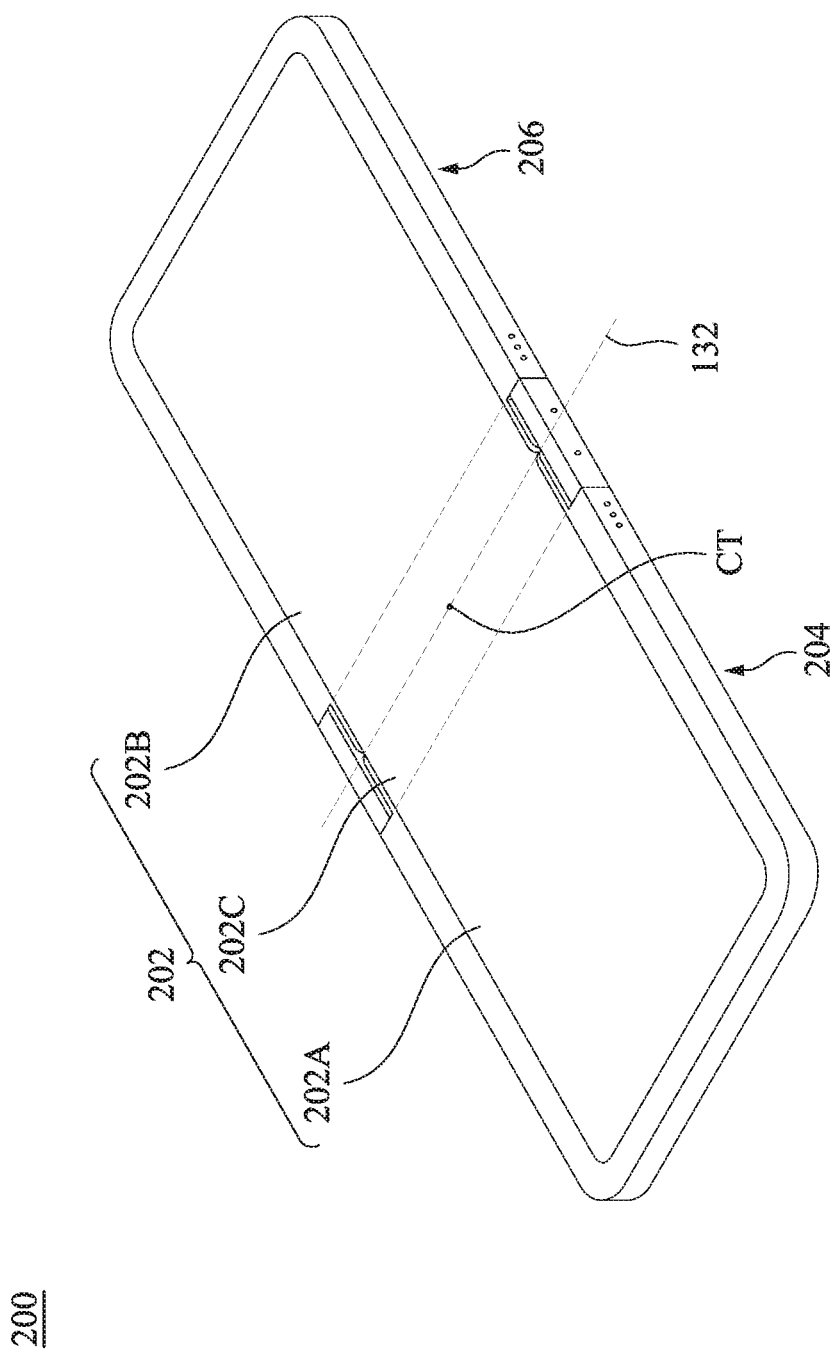
FIG. 9 is a perspective view of a foldable display apparatus in accordance with another embodiment of the present disclosure.
Figure 10:
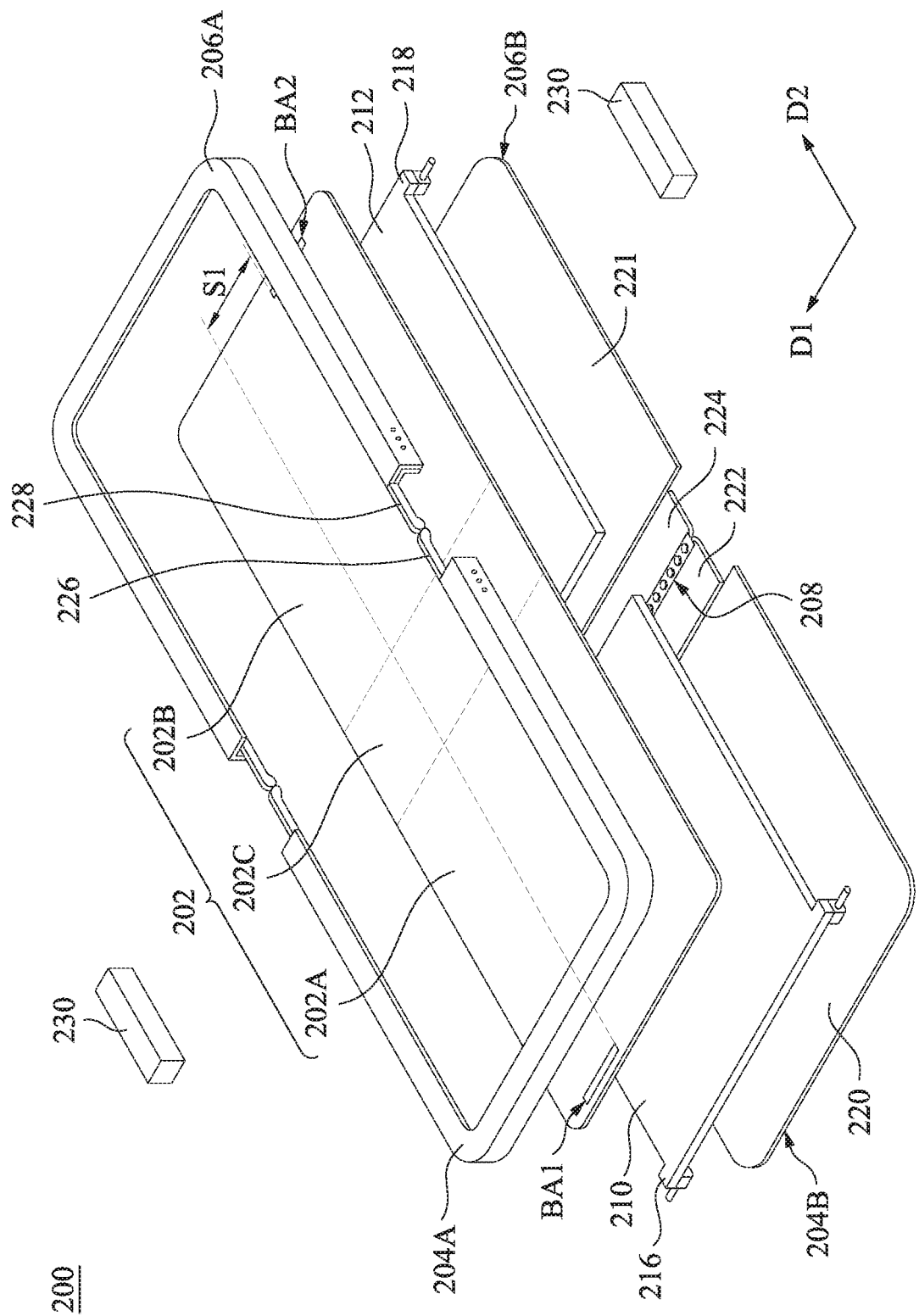
FIG. 10 is an exploded perspective view of the foldable display apparatus in FIG. 9.

FIG. 9 is a perspective view of a foldable display apparatus 200 in accordance with another embodiment of the present disclosure. FIG. 10 is an exploded perspective view of the foldable display apparatus 200 in FIG. 9. Reference is made to FIG. 9 and FIG. 10. The foldable display apparatus 200 includes a foldable display panel 202, a first shell 204, a second shell 206, a hinge element 208, a first supporting element 210 and a second supporting element 212. The foldable display apparatus 200 may further include a touch panel (not shown) and a protective layer (not shown) disposed on the foldable display apparatus 200 in sequence. The touch panel may be used to sense a user's touch operation. The protective layer is formed of a transparent hard material to transmit a display image of the foldable display panel 202 and can protect the foldable display panel 202 from an external impact.

The foldable display panel 202 includes a first plane area 202A, a second plane area 202B and a foldable area 202C. The first plane area 202A and the second plane area 202B are on two sides of the foldable area 202C. The first shell 204 and the second shell 206 are coupled to the foldable area 202C and are used to accommodate the foldable display panel 202. The foldable line 132 passes through a center CT of the foldable area 202C. Rotation points of the first shell 204 and the second shell 206 are on the foldable area 202C and connected with each other by the hinge element 208. The hinge element 208 is used to connect to the first shell 204 and the second shell 206.

The first shell 204 includes a first frame portion 204A and a first bottom portion 204B. The first frame portion 204A is used to surround a periphery of the first plane area 202A of the foldable display panel 202. The first bottom portion 204B is used to accommodate the first plane area 202A of the foldable display panel 202. The second shell 206 includes a second frame portion 206A and a second bottom portion 206B. The second frame portion 206A is used to surround a periphery of the second plane area 202B of the foldable display panel 202. The second bottom portion 206B is used to accommodate the second plane area 202B of the foldable display panel 202. The first frame portion 204A and the second frame portion 206A further include a curved protrusion 226 and a curved protrusion 228, respectively. The curved protrusion 226 is formed to protrude from the first frame portion 204A. The curved protrusion 228 is formed to protrude from the second frame portion 206A.

The first supporting element 210 and the second supporting element 212 are used to support the foldable display panel 202 in a folded state or an unfolded state. For example, the first supporting element 210 is between the foldable display panel 202 and the first bottom portion 204B of the first shell 204, and is rotatably mounted to the first frame portion 204A of the first shell 204 by the first hinge 216. The second supporting element 212 is between the foldable display panel 202 and the second bottom portion 206B of the second shell 206, and is rotatably mounted to the second frame portion 206A of the second shell 206 by the second hinge 218. Therefore, when the foldable display apparatus 200 is unfolded, the first supporting element 210 and the second supporting element 212 can respectively support the foldable display panel 202 while rotating in relative to the first hinge 216 and the second hinge 218, respectively.

In some embodiments, the foldable display apparatus 200 can further include side mounting portions 230. The side mounting portions 230 are disposed corresponding to sides of the foldable area 202C of the foldable display panel 202. The side mounting portion 230 on one side is mounted to the first bottom portion 204B and the second bottom portion 206B. The side mounting portion 230 on another side is mounted to each rotation point of the first frame portion 204A and the second frame portion 206A.

The first bottom portion 204B includes a plane portion 220 and a first curved portion 222. The second bottom portion 206B includes a plane portion 221 and a second curved portion 224. The first curved portion 222 and the second curved portion 224 are used to connect the plane portion 220 and the plane portion 221. The first curved portion 222 and the second curved portion 224 are connected with each other by the hinge element 208. When the foldable display apparatus 200 is unfolded, the first plane area 202A and the second plane area 202B of the foldable display panel 202 are supported by the first bottom portion 204B of the first shell 204 and the second bottom portion 206B of the second shell 206. The foldable area 202C is supported by the hinge element 208.

Based on above, the foldable display panel of at least one embodiment of the present disclosure includes at least one first bonding area and at least one second bonding area. The first bonding area and the second bonding area are on opposite first and second sides of the periphery area, respectively. The first bonding area and the second bonding area are spaced apart along the first direction by the first distance. The substrate has the foldable line passing through the center of the display area. The foldable line is between the first bonding area and the second bonding area and is parallel to the first direction. After the foldable display panel is folded along the foldable line such that the first side and the second side of the substrate overlap with each other, the first bonding area do not overlap the second bonding area. In other words, the first bonding area may be free from in contact with the second bonding area. Therefore, the first bonding pads on the first bonding area and the second bonding pads on the second bonding area are free from colliding with each other and damaged. The first printed circuit board on the first bonding area and the second printed circuit board on the second bonding area are free from colliding with each other and damaged as well.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A foldable display panel, comprising:
   a substrate including a surface and a display area and a periphery area on the surface, wherein the periphery area is on at least one side of the display area, the periphery area has at least one first bonding area and at least one second bonding area, the first bonding area and the second bonding area are at opposite first and second sides of the periphery area, respectively, the first bonding area and the second bonding area are spaced apart along a first direction by a first distance, the substrate has a foldable line passing through a center of the display area, the foldable line is between the first bonding area and the second bonding area and is parallel to the first direction, and the first side and the second side are on two sides of the foldable line, respectively; and
   a pixel array on the display area and overlaps the foldable line, wherein the pixel array is between the first side and the second side, the pixel array includes a plurality of sub pixel units, and the sub pixel units are arranged in an array.

2. The foldable display panel of claim 1, further comprising:
   a plurality of first bonding pads disposed on the first bonding area;
   a plurality of first signal lines connected between the first bonding pads and a portion of the sub pixel units;
   a plurality of second bonding pads disposed on the second bonding area; and
   a plurality of second signal lines connected between the second bonding pads and another portion of the sub pixel units.

3. The foldable display panel of claim 1, wherein the periphery area has opposite third and fourth sides, the third side and the fourth side are between the first side and the second side, a sum of a shortest distance between the first bonding area and the third side and a length of the first bonding area along the first direction is less than a shortest distance between the second bonding area and the third side.

4. The foldable display panel of claim 3, wherein the number of the first bonding area is multiple, the first bonding areas are arranged at a first interval along the first direction, a sum of the shortest distance between the first bonding area and the third side, the length of the first bonding area along the first direction and the first interval is greater than a sum of the shortest distance between the second bonding area and the third side and a length of the second bonding area along the first direction.

5. The foldable display panel of claim 3, wherein the number of the first bonding area is multiple, the first bonding areas are arranged at a first interval along the first direction, the number of the second bonding area is multiple, the second bonding areas are arranged at a second interval along the first direction, a sum of the shortest distance between the first bonding area and the third side, twice the length of the first bonding area along the first direction and the first interval is less than a sum of the shortest distance between the second bonding area and the third side, a length of the second bonding area along the first direction and the second interval.

6. The foldable display panel of claim 3, wherein a shortest distance between the second bonding area and the third side is greater than a length of the first bonding area along the first direction.

7. The foldable display panel of claim 3, wherein a shortest distance between the first bonding area and the fourth side is greater than a sum of a shortest distance between the second bonding area and the fourth side and a length of the second bonding area along the first direction.

8. The foldable display panel of claim 2, further comprising:
   at least one driving chip disposed on the first bonding area and is electrically connected to the first bonding pads.

9. The foldable display panel of claim 8, further comprising:
   an anisotropic conductive adhesive disposed on the first bonding area, the anisotropic conductive adhesive being between the driving chip and the first bonding pads.

10. The foldable display panel of claim 1, further comprising:
   a plurality of scan lines disposed on the display area; and
   a plurality of data lines disposed on the display area, each of the sub pixel units being electrically connected to one of the scan lines and one of the data lines, each of the sub pixel units having at least one thin film transistor and an organic light emitting diode, and the organic light emitting diode being electrically connected to the thin film transistor.

* * * * *